United States Patent
Jiang et al.

(10) Patent No.: US 12,362,764 B2
(45) Date of Patent: Jul. 15, 2025

(54) NEURAL NETWORK MODEL COMPRESSION WITH QUANTIZABILITY REGULARIZATION

(71) Applicant: TENCENT AMERICA LLC, Palo Alto, CA (US)

(72) Inventors: Wei Jiang, San Jose, CA (US); Wei Wang, Palo Alto, CA (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 1035 days.

(21) Appl. No.: 17/073,602

(22) Filed: Oct. 19, 2020

(65) Prior Publication Data

US 2021/0201157 A1 Jul. 1, 2021

Related U.S. Application Data

(60) Provisional application No. 62/954,472, filed on Dec. 28, 2019.

(51) Int. Cl.
| | |
|---|---|
| H03M 7/30 | (2006.01) |
| G06F 18/214 | (2023.01) |
| G06N 3/04 | (2023.01) |
| G06N 3/063 | (2023.01) |
| G06N 3/084 | (2023.01) |
| G06V 10/771 | (2022.01) |

(52) U.S. Cl.
CPC ........ *H03M 7/3059* (2013.01); *G06F 18/214* (2023.01); *G06N 3/04* (2013.01); *G06N 3/063* (2013.01); *G06N 3/084* (2013.01); *G06V 10/771* (2022.01); *H03M 7/702* (2013.01)

(58) Field of Classification Search
CPC ...... H03M 7/3059; H03M 7/702; H03M 7/70; G06F 18/214; G06F 18/2113; G06N 3/04; G06N 3/063; G06N 3/084; G06N 3/045; G06N 3/082; G06V 10/771
See application file for complete search history.

(56) References Cited

U.S. PATENT DOCUMENTS

| | | | |
|---|---|---|---|
| 10,594,338 B1* | 3/2020 | Lew ............. | H03M 7/4043 |
| 2008/0207222 A1* | 8/2008 | Bhattacharya ...... | H04W 4/029 |
| | | | 455/456.1 |
| 2019/0042743 A1* | 2/2019 | Chen .............. | G06N 20/00 |
| 2019/0294413 A1* | 9/2019 | Vantrease ........... | G06F 7/5095 |

(Continued)

OTHER PUBLICATIONS

Chen, Shangyu, Wenya Wang, and Sinno Jialin Pan. "Deep neural network quantization via layer-wise optimization using limited training data." Proceedings of the AAAI Conference on Artificial Intelligence. vol. 33. No. 01. 2019. (Year: 2019).*

(Continued)

*Primary Examiner* — Miranda M Huang
*Assistant Examiner* — Sidney Vincent Bostwick
(74) *Attorney, Agent, or Firm* — Sughrue Mion, PLLC

(57) ABSTRACT

A method, computer program, and computer system is provided for compressing a neural network model. A multi-dimensional tensor corresponding to a set of weight coefficients associated with a neural network is reshaped. A subset of weight coefficients is identified from among the set of weight coefficients. A model of the neural network is compressed based on the identified subset of weight coefficients.

12 Claims, 6 Drawing Sheets

(56) References Cited

U.S. PATENT DOCUMENTS

2019/0340499 A1* 11/2019 Burger ................ G06N 3/084
2020/0151573 A1* 5/2020 Das .................... G06N 3/04
2020/0380357 A1* 12/2020 Yao .................... G06N 3/08

OTHER PUBLICATIONS

Farabet, Clément. Towards real-time image understanding with convolutional networks. Diss. Paris Est, 2013. (Year: 2013).*
Carreira-Perpinán, Miguel A. "Model compression as constrained optimization, with application to neural nets. Part I: General framework." arXiv preprint arXiv:1707.01209 (2017). (Year: 2017).*
Shi, Zenglin, Yangdong Ye, and Yunpeng Wu. "Rank-based pooling for deep convolutional neural networks." Neural Networks 83 (2016): 21-31. (Year: 2016).*
Jianbo Ye et al., "Rethinking the Smaller-Norm-Less-Informative Assumption in Channel Pruning of Convolution Layers", Published as a conference paper at ICLR 2018, pp. 1-11.
Song Han et al., "Learning both Weights and Connections for Efficient Neural Networks", pp. 1-9.

* cited by examiner

NEURAL NETWORK MODEL COMPRESSION WITH QUANTIZABILITY REGULARIZATION

CROSS-REFERENCE TO RELATED APPLICATION

This application claims priority from U.S. Provisional Patent Application No. 62/954,472, filed on Dec. 28, 2019, in the U.S. Patent and Trademark Office, which is incorporated herein by reference in its entirety.

FIELD

This disclosure relates generally to field of data processing, and more particularly to neural networks.

BACKGROUND

ISO/IEC MPEG (JTC 1/SC 29/WG 11) has been actively searching for potential needs for standardization of future video coding technology for visual analysis and understanding. The Compact Descriptors for Visual Search (CDVS) standard was adopted by ISO in 2015 as a still-image standard, which extracts feature representations for image similarity matching. The Compact Descriptors for Visual Analysis (CDVS) standard is listed as Part 15 of MPEG 7 and ISO/IEC 15938-15 and was finalized in 2018, which extracts global and local, hand-designed and DNN-based, feature descriptors for video segments. The success of Deep Neural Network (DNN) in a large range of video applications such as semantic classification, target detection/recognition, target tracking, video quality enhancement, etc. poses a strong need for compressing the DNN models.

SUMMARY

Embodiments relate to a method, system, and computer readable medium for compressing a neural network model. According to one aspect, a method for compressing a neural network model is provided. The method may include reshaping a multi-dimensional tensor corresponding to a set of weight coefficients associated with a neural network. A subset of weight coefficients is identified from among the set of weight coefficients. A model of the neural network is compressed based on the identified subset of weight coefficients.

According to another aspect, a computer system for compressing a neural network model is provided. The computer system may include one or more processors, one or more computer-readable memories, one or more computer-readable tangible storage devices, and program instructions stored on at least one of the one or more storage devices for execution by at least one of the one or more processors via at least one of the one or more memories, whereby the computer system is capable of performing a method. The method may include reshaping a multi-dimensional tensor corresponding to a set of weight coefficients associated with a neural network. A subset of weight coefficients is identified from among the set of weight coefficients. A model of the neural network is compressed based on the identified subset of weight coefficients.

According to yet another aspect, a computer readable medium for compressing a neural network model is provided. The computer readable medium may include one or more computer-readable storage devices and program instructions stored on at least one of the one or more tangible storage devices, the program instructions executable by a processor. The program instructions are executable by a processor for performing a method that may accordingly include reshaping a multi-dimensional tensor corresponding to a set of weight coefficients associated with a neural network. A subset of weight coefficients is identified from among the set of weight coefficients. A model of the neural network is compressed based on the identified subset of weight coefficients.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings.

DETAILED DESCRIPTION

Figure 1:
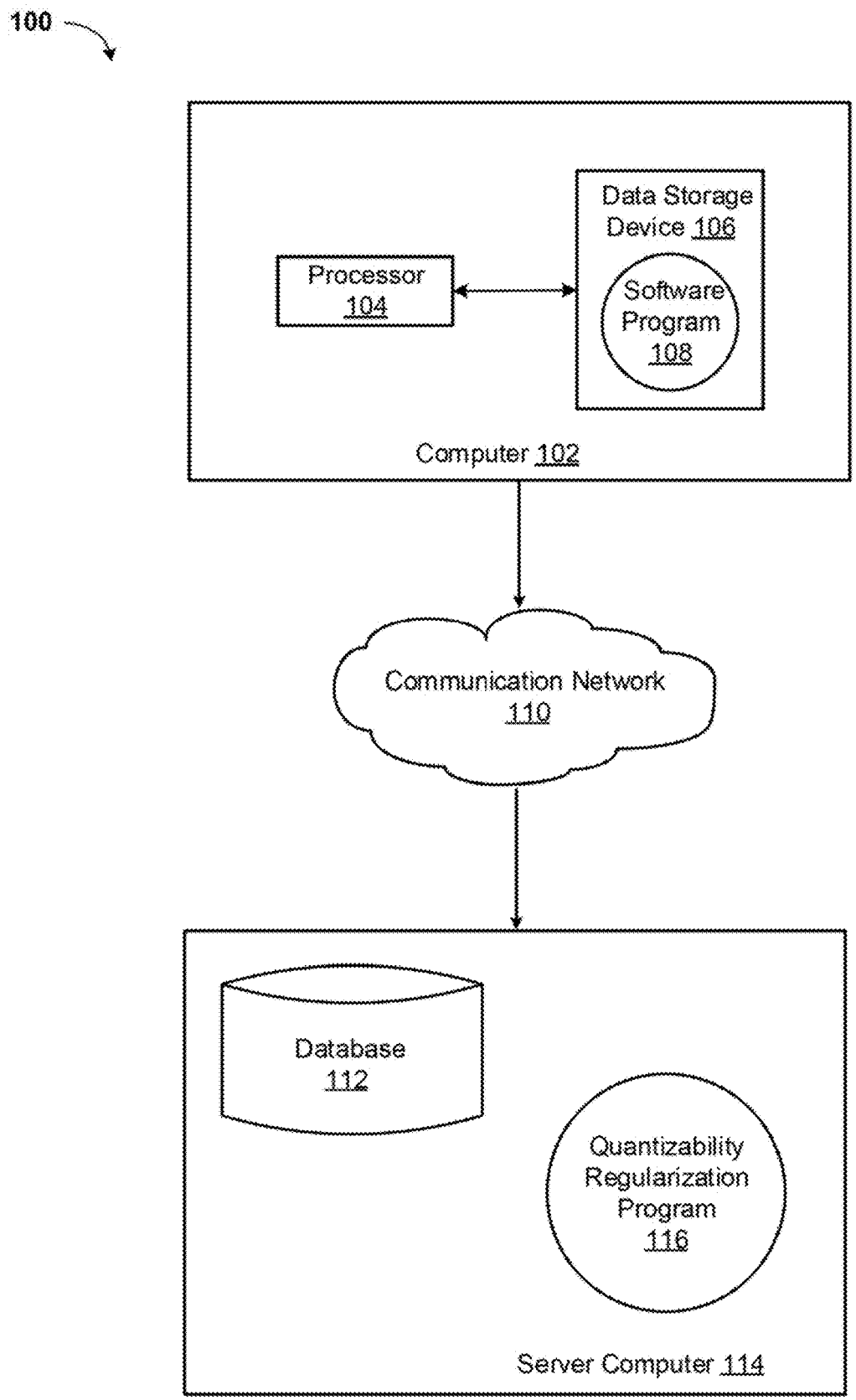
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments relate generally to the field of data processing, and more particularly to neural networks. The following described exemplary embodiments provide a system, method and computer program to, among other things, compress neural network models based on quantizability regularization. Therefore, some embodiments have the capacity to improve the field of computing by allowing for improved compression efficiency of learned weight coefficients, which can significantly reduce a deep neural network model size.

As previously described, ISO/IEC MPEG (JTC 1/SC 29/WG 11) has been actively searching for potential needs for standardization of future video coding technology for visual analysis and understanding. The Compact Descriptors for Visual Search (CDVS) standard was adopted by ISO in 2015 as a still-image standard, which extracts feature representations for image similarity matching. The Compact Descriptors for Visual Analysis (CDVS) standard is listed as Part 15 of MPEG 7 and ISO/IEC 15938-15 and was finalized in 2018, which extracts global and local, hand-designed and DNN-based, feature descriptors for video segments. The success of Deep Neural Network (DNN) in a large range of video applications such as semantic classification, target detection/recognition, target tracking, video quality enhancement, etc. poses a strong need for compressing the DNN models.

MPEG is actively working on the Coded Representation of Neural Network standard (NNR), which encodes DNN models to save both storage and computation. There exist several approaches for learning a compact DNN model. The target is to remove unimportant weight coefficients and the assumption is that the smaller the weight coefficients are in value, the less their importance are. Several network pruning methods have been proposed to explicitly pursue this goal, by adding sparsity-promoting regularization terms into the network training target, or by greedily removing network parameters. From the perspective of compressing DNN models, after learning a compact network model, the weight coefficients can be further compressed by quantization followed by entropy coding. Such further compression processes can significantly reduce the storage size of the DNN model, which are essential for model deployment over mobile devices, chips, etc.

A quantizability regularization loss may be used to improve quantization efficiency. An iterative network retraining/refining process is used to jointly optimize the original training target and the quantizability regularization loss, so that the learned network weight coefficients preserves the original performance and are suitable for further compression through quantization and entropy coding. The method, computer system, and computer readable medium discussed herein can be applied to compress the original pre-trained DNN model. It can also be used as an additional processing module to further compress any pruned DNN model.

This disclosure proposes a method of compressing a Deep Neural Network (DNN) model by using quantizability regularization in an iterative network retraining/fine-tuning framework. Quantizability regularization may improve the efficiency of further compression of the learned weight coefficients, which can significantly reduce the DNN model size. Through the iterative retraining process, target training target may be maintained in order to pursue quantization efficiency. The iterative retraining process also gives the flexibility of introducing different loss at different times, making the system focus on different target during the optimization process. Datasets with different data forms may be able to be used. The input/output data are general 4D tensors, which can be real video segments, images, or extracted feature maps.

Aspects are described herein with reference to flowchart illustrations and/or block diagrams of methods, apparatus (systems), and computer readable media according to the various embodiments. It will be understood that each block of the flowchart illustrations and/or block diagrams, and combinations of blocks in the flowchart illustrations and/or block diagrams, can be implemented by computer readable program instructions.

Referring now to FIG. 1, a functional block diagram of a networked computer environment illustrating a neural network models compression system 100 (hereinafter "system") for compressing a neural network model based on quantizability regularization. It should be appreciated that FIG. 1 provides only an illustration of one implementation and does not imply any limitations with regard to the environments in which different embodiments may be implemented. Many modifications to the depicted environments may be made based on design and implementation requirements.

The system 100 may include a computer 102 and a server computer 114. The computer 102 may communicate with the server computer 114 via a communication network 110 (hereinafter "network"). The computer 102 may include a processor 104 and a software program 108 that is stored on a data storage device 106 and is enabled to interface with a user and communicate with the server computer 114. As will be discussed below with reference to FIG. 4 the computer 102 may include internal components 800A and external components 900A, respectively, and the server computer 114 may include internal components 800B and external components 900B, respectively. The computer 102 may be, for example, a mobile device, a telephone, a personal digital assistant, a netbook, a laptop computer, a tablet computer, a desktop computer, or any type of computing devices capable of running a program, accessing a network, and accessing a database.

The server computer 114 may also operate in a cloud computing service model, such as Software as a Service (SaaS), Platform as a Service (PaaS), or Infrastructure as a Service (IaaS), as discussed below with respect to FIGS. 5 and 6. The server computer 114 may also be located in a cloud computing deployment model, such as a private cloud, community cloud, public cloud, or hybrid cloud.

The server computer 114, which may be used for compressing a neural network model is enabled to run a Quantizability Regularization Program 116 (hereinafter "program") that may interact with a database 112. The Quantizability Regularization Program method is explained in more detail below with respect to FIG. 3. In one embodiment, the computer 102 may operate as an input device including a user interface while the program 116 may run primarily on server computer 114. In an alternative embodiment, the program 116 may run primarily on one or more computers 102 while the server computer 114 may be used for processing and storage of data used by the program 116. It should be noted that the program 116 may be a standalone program or may be integrated into a larger quantizability regularization program.

It should be noted, however, that processing for the program 116 may, in some instances be shared amongst the computers 102 and the server computers 114 in any ratio. In another embodiment, the program 116 may operate on more than one computer, server computer, or some combination of computers and server computers, for example, a plurality of computers 102 communicating across the network 110 with a single server computer 114. In another embodiment, for example, the program 116 may operate on a plurality of server computers 114 communicating across the network 110 with a plurality of client computers. Alternatively, the program may operate on a network server communicating across the network with a server and a plurality of client computers.

The network 110 may include wired connections, wireless connections, fiber optic connections, or some combination thereof. In general, the network 110 can be any combination of connections and protocols that will support communications between the computer 102 and the server computer 114. The network 110 may include various types of networks, such as, for example, a local area network (LAN), a wide area network (WAN) such as the Internet, a telecommunication network such as the Public Switched Telephone Network (PSTN), a wireless network, a public switched network, a satellite network, a cellular network (e.g., a fifth generation (5G) network, a long-term evolution (LTE) network, a third generation (3G) network, a code division multiple access (CDMA) network, etc.), a public land mobile network (PLMN), a metropolitan area network (MAN), a private network, an ad hoc network, an intranet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of system 100 may perform one or more functions described as being performed by another set of devices of system 100.

Figure 2:
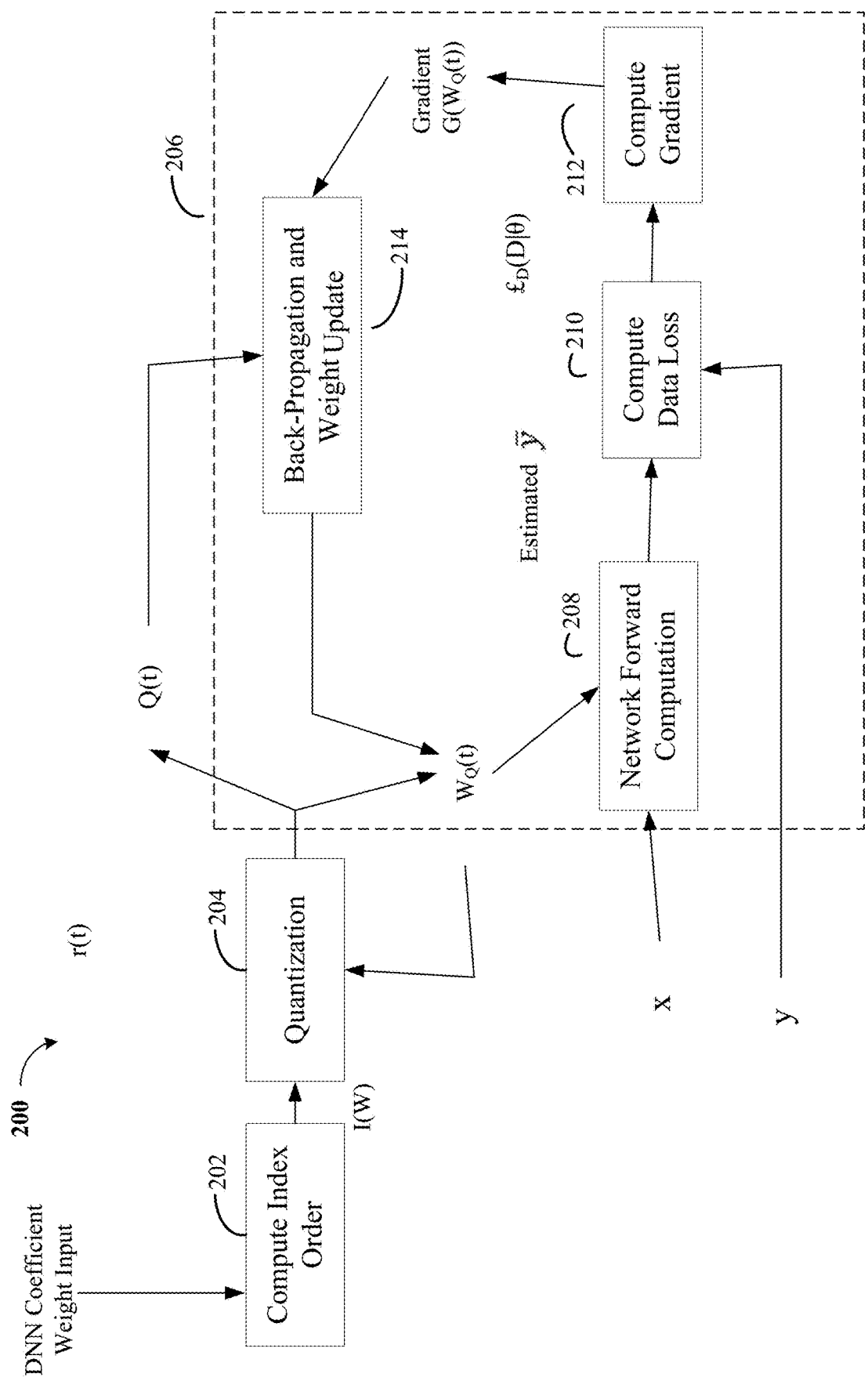
FIG. 2 is a block diagram of a neural network model compression system, according to at least one embodiment.

Referring now to FIG. 2, a neural network model compression system 200 is depicted. The neural network model compression system 200 may be used as a framework of the iterative learning process. The neural network model compression system 200 may include a computer index order module 202, a quantization module 204, and a retraining module 206. The retraining module 206 may include, among other things, a network forward computation module 208, a compute data loss module 210, a compute gradient module 212, and a back propagation and weight update module 214.

$D = \{(x,y)\}$ may denote a data set where a target y may be assigned to an input x. $\Theta=\{w\}$ may denote a set of weight coefficients of a DNN. The target of network training may be to learn an optimal set of weight coefficients $\Theta^*$ so that a loss $£(D|\Theta)$ can be minimized. For example, in previous network pruning approaches, the loss $£(D|\Theta)$ has two parts, an empirical data loss $£D(D|\Theta)$ and a sparsity-promoting regularization loss $£_R(\Theta)$:

$$£(D|\Theta)=\lambda D\, £D\,(D|\Theta)+\lambda_R £_R(\Theta)),$$

where $\lambda D$ and $\lambda_R$ are hyper-parameters balancing the contributions of the data loss and the regularization loss.

The sparsity-promoting regularization loss places regularization over the entire weight coefficients, and the resulting sparse weights have weak relationship with the inference efficiency or computation acceleration. From another perspective, after pruning, the sparse weights can further go through another network training process where an optimal set of weight coefficients can be learned that can improve the quantization efficiency for further model compression.

Therefore, a quantizability regularization loss $£_Q(D|\Theta)$ may be computed such that:

$$£(D|\Theta)=\lambda D\, £D\,(D|\Theta)+\lambda_Q £_Q(\Theta)$$

where $\lambda D$ and $\lambda_Q$ are hyperparameters to balance the contributions of the data loss and the quantization loss. By jointly optimizing $£(D|\Theta)$, the optimal set of weight coefficients that can largely help the quantization and coding process for further compression can be obtained. Additionally, the quantizability regularization loss may take into consideration the underlying process of how the convolution operation may be performed as a GEMM matrix multiplication process, resulting in quantized weight coefficients that can largely accelerate computation.

For both the learning effectiveness and the learning efficiency, an iterative optimization process may be further used for training. Parts of the weight coefficients satisfying the desired design structure may be fixed. The non-fixed parts of the weight coefficients may be updated by back-propagating the training loss. By iteratively conducting these two steps, more and more weights can be fixed gradually, and the joint loss can be gradually optimized effectively.

Moreover, since each layer may be compressed individually, $£_Q(D|\Theta))$ can be further written as $$£_Q(\Theta)=\Sigma_{j=1}^N L_Q(W^j),$$

where $L_Q(W^j)$ may be a quantization loss defined over the j-th layer; N may be the total number of layers where the quantization loss may be measured; and $W^j$ denotes the weight coefficients of the j-th layer. Since $L_Q(W^j)$ may be computed for each layer independently, it may be appreciated that the script j may be omitted without loss of generality.

For each network layer, its weight coefficients W may be a general 5-Dimension (5D) tensor with size $(c_i, k_1, k_2, k_3, c_o)$. The input of the layer may be a 4-Dimension (4D) tensor A of size $(h_i, w_i, d_i, c_i)$, and the output of the layer may be a 4D tensor B of size $(h_o, w_o, d_o, c_o)$. The sizes $c_i, k_1, k_2, k_3, c_o, h_i, w_i, d_i, h_o, w_o, d_o$ are integer numbers greater or equal to 1. When any of the sizes $c_i, k_1, k_2, k_3, c_o, h_i, w_i, d_i, h_o, w_o, d_o$ takes number 1, the corresponding tensor reduces to a lower dimension. Each item in each tensor may be a floating number. M may denote a 5D binary mask of the same size as W, where each item in M may be a binary number 0/1 indicating whether the corresponding weight coefficient may be pruned/kept. M may be introduced to be associated with W to cope with the case where W may be from a pruned DNN model. When W may be from the original unpruned pretrained model, all items in M take value 1. The output B is computed through the convolution operation $\Theta$ based on A, M and W:

$$B_{l',m',n',v} = \sum_{r=1}^{k_1}\sum_{s=1}^{k_2}\sum_{t}^{k_3}\sum_{u=1}^{c_i} M_{u,r,s,t,v} W_{u,r,s,t,v} A_{u,l-\frac{k_1-1}{2}+r,m-\frac{k_2-1}{2}+s,n-\frac{k_3-1}{2}+t}$$

$$l=1,\ldots,h_i, m=1,\ldots,w_i, n=1,\ldots,d_i, l'=1,\ldots,h_o,$$

$$m'=1,\ldots,w_o, n'=1,\ldots,d_o, v=1,\ldots,c_o.$$

The parameters $h_i$, $w_i$ and $d_i$ ($h_o$, $w_o$ and $d_o$) are the height, weight and depth of the input tensor A (output tensor B). The parameter $c_i$ ($c_o$) may be the number of input (output) channel. The parameters $k_1$, $k_2$ and $k_3$ are the size of the convolution kernel corresponding to the height, weight and depth axes, respectively. That is, for each output channel $v=1,\ldots,c_o$, the operation may be described as a 4D weight tensor W, of size $(c_i, k_1, k_2, k_3)$ convolving with the input A.

It may be appreciated that the order of the summation can be changed. In one or more embodiments, the 5D weight tensor may be reshaped into a 3D tensor of size $(c_i, c_o, k)$ where $k=k_1 \cdot k_2 \cdot k_3$. The order of reshaped index along the k axis may be determined by a reshaping algorithm in a reshaping process.

The desired structure of the weight coefficients may be designed by taking into consideration two aspects. The structure of the weight coefficients may be aligned with the underlying GEMM matrix multiplication process of how the convolution operation may be implemented so that the inference computation of using the learned weight coefficients may be accelerated. The structure of the weight coefficients can help to improve the quantization and entropy coding efficiency. In one embodiment, a block-wise structure may be used for the weight coefficients in each layer in the 3D reshaped weight tensor. Specifically, the 3D tensor may be partitioned into blocks of size $(g_i, g_o, g_k)$, and all coefficients within the block may take the same value. In this way, one value can be used to represent the whole block in the quantization process which yields high efficiency. Given this desired structure, during an iteration, the part of the weight coefficients to be fixed may be determined. For example, the variance of the weights within each block may be computed, and when the variance may be smaller than a given threshold, the weights within that block are all set to be the mean value of that block. The neural network training process may be performed to update the remaining un-fixed weight coefficients through the back-propagation mechanism. The threshold can be a pre-determined hyperparameter, or can change (e.g., decreasing) so that more weights can be fixed gradually for later iterations during training.

Using a pre-trained DNN model with weight coefficients W and mask M, which can be either a pruned sparse model or an un-pruned non-sparse model, the order of indexes $I(W)=[i_0, \ldots, i_k]$ may be determined to reshape the weight coefficients W and mask M through the compute index order module 202, where $k=k_1 \cdot k_2 \cdot k_3$ may be the reshaped 3D tensor of weights W. In one embodiment, I(W) may be determined by roughly predicting the quantization loss of the quantized reshaped weights as follows. For the p-th 3D block $b_p$ in the reshaped 3D tensor of weights W of size $(g_i, g_o, g_k)$, $mean_p$ and $N_p$ may denote the mean and $L_N$ norm of the weight coefficients within the block. For example, the L2 norm would be the variance of the weight coefficients within the block. The $L_N$ norm reflects the error $e(b_p)$ of using the mean value $mean_p$ to represent the entire block. For each possible way of reordering the indexes to generate a 3D tensor of weights W, the overall error of performing quantization may be computed by averaging the $e(b_p)$ across all the 3D blocks, and I(W) may be the one with the smallest overall error. When k may be small, there may be an exhaustive search for the best I(W). For large k, other methods can be used to find suboptimal I(W). It may be appreciated I(W) may be determined using substantially any method.

After obtaining the order of indexes I(W) to reshape the weight coefficients, the target may be to find a set of updated optimal weight coefficients W*, weight mask M*, and weight quantization mask Q* by iteratively minimizing the total loss. for the t-th iteration, there may be current weight coefficients W(t−1), mask M(t−1), and weight quantization mask Q(t−1). A quantized weight coefficients $W_Q(t)$ and a new quantization mask Q(t) are computed through the quantization module 204. In the quantization module 204, for the p-th 3D block $b_p$ of size $(g_i, g_o, g_k)$ of the reshaped 3D weight tensor W using the reordering index I(W), the $L_N$ norm $N_p$ may be computed, which may reflect the quantization error $e(b_p)$ of using the mean value $mean_p$ to represent the entire block. All the 3D blocks of the reshaped 3D weight tensor may be ranked according to their quantization errors ($L_N$ norm) in accenting order, and the top r(t) blocks will be quantized and fixed. That is, the weight coefficients of W(t) within a fixed block $b_p$ may be set as the $mean_p$, and the corresponding items in the quantization mask Q(t) may be set as 1. This will generate the quantized weight coefficients $W_Q(t)$ and the corresponding quantization mask Q(t).

Given the training data set $\mathcal{D}=\{(x,y)\}$, where $\mathcal{D}$ can be the same as the original dataset $\mathcal{D}_0=\{(x_0, y_0)\}$ based on which the pre-trained weight coefficients Ware obtained. $\mathcal{D}$ can also be a different dataset from $\mathcal{D}_0$, but with the same data distribution as the original dataset $\mathcal{D}$. After obtaining the quantized weight coefficients $W_Q(t)$ and corresponding quantization mask Q(t), the system goes through a retraining process to adjust non-fixed weight coefficients. Specifically, each input x may be passed though the network via the network forward computation module 208 using the current weight coefficients $W_Q(t)$, which generates an estimated output $\bar{y}$. Based on the ground-truth annotation y and the estimated output y, the data loss $\mathcal{L}_D(\mathcal{D}|\Theta))$ can be computed through the compute data loss module 210. The gradient of the data loss $G(W_Q(t))$ can be computed by the compute gradient module 212. The automatic gradient computing method used by deep learning frameworks such as tensorflow or pytorch can be used here to compute $G(W_Q(t))$. Based on the gradient $G(W_Q(t))$ and the quantization mask Q(t), the non-fixed weight coefficients of $W_Q(t)$ can be updated through BP using the back propagation and weight update module 214. The retraining module 206 may perform an iterative process, such that multiple iterations may be taken to update the non-fixed parts of $W_Q(t)$, e.g., until the data loss converges. The system 200 may move to the next iteration t+1, where given a new quantization ratio r (t+1), based on $W_Q(t)$ and I(W), a new quantized weight coefficients $W_Q(t+1)$ and the corresponding quantization mask Q (t+1) can be computed through the Quantization process, and the system goes into the next iteration.

The quantization ratio r(t) may increase its value during each iteration as t increases, so that more and more weight coefficients will be quantized and fixed throughout the entire iterative learning process.

Figure 3:
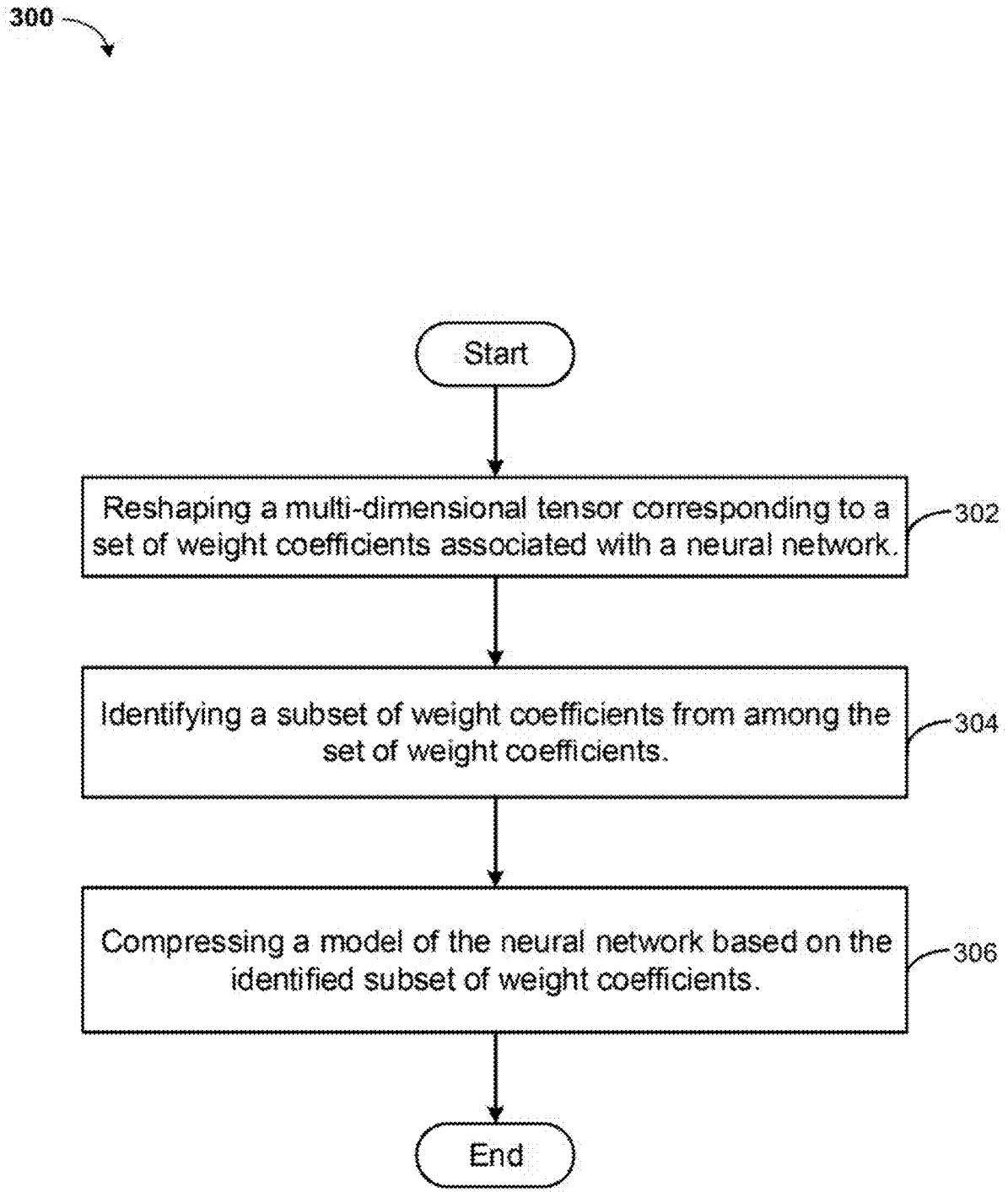
FIG. 3 is an operational flowchart illustrating the steps carried out by a program that compresses neural network models, according to at least one embodiment.

Referring now to FIG. 3, an operational flowchart illustrating the steps of a method 300 for compressing a neural network model is depicted. In some implementations, one or more process blocks of FIG. 3 may be performed by the computer 102 (FIG. 1) and the server computer 114 (FIG. 1). In some implementations, one or more process blocks of FIG. 3 may be performed by another device or a group of devices separate from or including the computer 102 and the server computer 114.

At 302, the method 300 includes reshaping a multi-dimensional tensor corresponding to a set of weight coefficients associated with a neural network.

At 304, the method 300 includes identifying a subset of weight coefficients from among the set of weight coefficients.

At 306, the method 300 includes compressing a model of the neural network based on the identified subset of weight coefficients.

It may be appreciated that FIG. 3 provides only an illustration of one implementation and does not imply any limitations with regard to how different embodiments may be implemented. Many modifications to the depicted environments may be made based on design and implementation requirements.

Figure 4:
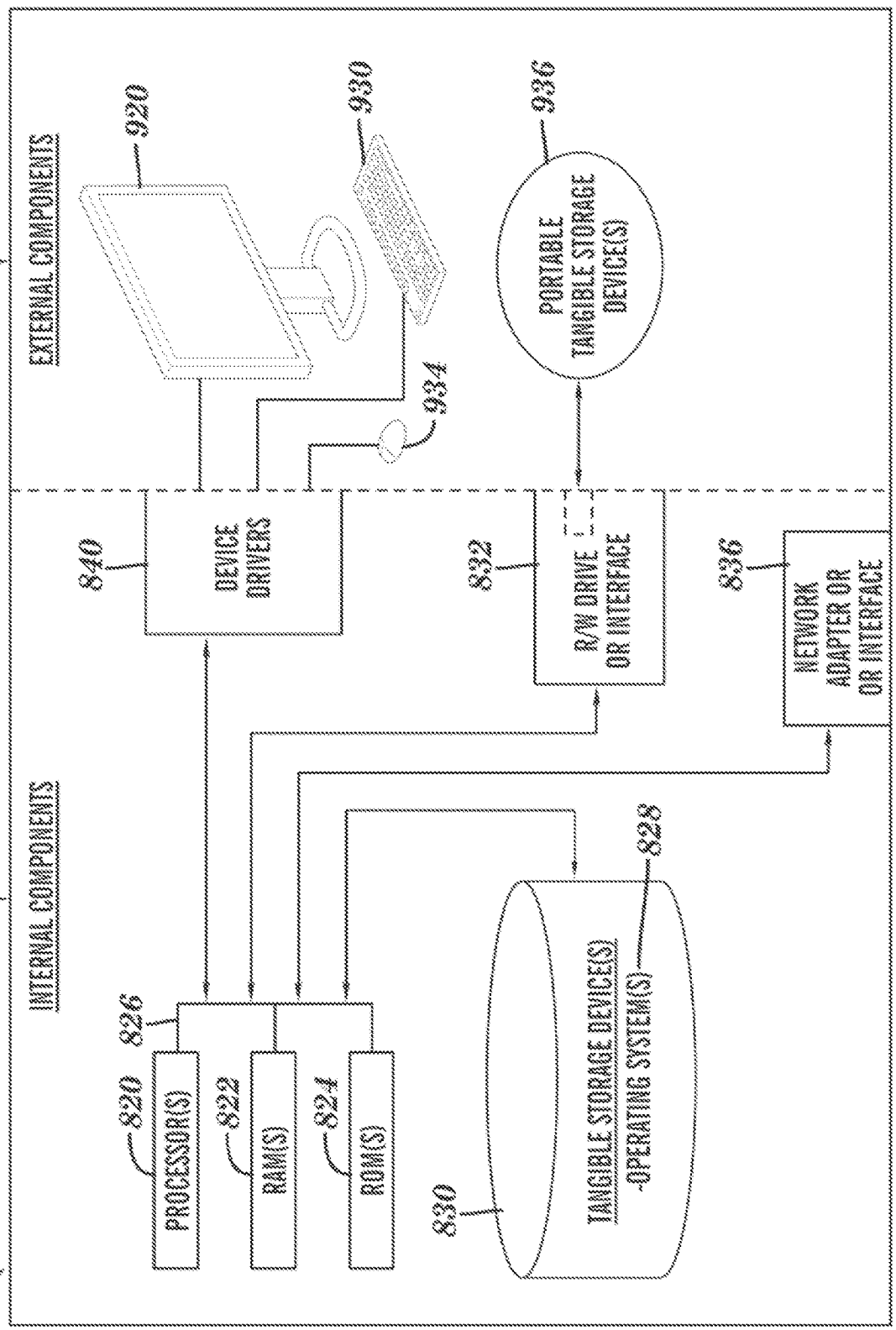
FIG. 4 is a block diagram of internal and external components of computers and servers depicted in FIG. 1 according to at least one embodiment.

FIG. 4 is a block diagram 400 of internal and external components of computers depicted in FIG. 1 in accordance with an illustrative embodiment. It should be appreciated that FIG. 4 provides only an illustration of one implementation and does not imply any limitations with regard to the environments in which different embodiments may be implemented. Many modifications to the depicted environments may be made based on design and implementation requirements.

Computer 102 (FIG. 1) and server computer 114 (FIG. 1) may include respective sets of internal components 800A,B and external components 900A,B illustrated in FIG. 4. Each of the sets of internal components 800 include one or more processors 820, one or more computer-readable RAMs 822 and one or more computer-readable ROMs 824 on one or more buses 826, one or more operating systems 828, and one or more computer-readable tangible storage devices 830.

Processor 820 is implemented in hardware, firmware, or a combination of hardware and software. Processor 820 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 820 includes one or more processors capable of being programmed to perform a function. Bus 826 includes a component that permits communication among the internal components 800A,B.

The one or more operating systems 828, the software program 108 (FIG. 1) and the Quantizability Regularization Program 116 (FIG. 1) on server computer 114 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 4, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory, an optical disk, a magneto-optic disk, a solid state disk, a compact disc (CD), a digital versatile disc (DVD), a floppy disk, a cartridge, a magnetic tape, and/or another type of non-transitory computer-readable tangible storage device that can store a computer program and digital information.

Each set of internal components 800A,B also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as the software program 108 (FIG. 1) and the Quantizability Regularization Program 116 (FIG. 1) can be stored on one or more of the respective portable computer-readable tangible storage devices 936, read via the respective R/W drive or interface 832 and loaded into the respective hard drive 830.

Each set of internal components 800A,B also includes network adapters or interfaces 836 such as a TCP/IP adapter cards; wireless Wi-Fi interface cards; or 3G, 4G, or 5G wireless interface cards or other wired or wireless communication links. The software program 108 (FIG. 1) and the Quantizability Regularization Program 116 (FIG. 1) on the server computer 114 (FIG. 1) can be downloaded to the computer 102 (FIG. 1) and server computer 114 from an external computer via a network (for example, the Internet, a local area network or other, wide area network) and respective network adapters or interfaces 836. From the network adapters or interfaces 836, the software program 108 and the Quantizability Regularization Program 116 on the server computer 114 are loaded into the respective hard drive 830. The network may comprise copper wires, optical fibers, wireless transmission, routers, firewalls, switches, gateway computers and/or edge servers.

Each of the sets of external components 900A,B can include a computer display monitor 920, a keyboard 930, and a computer mouse 934. External components 900A,B can also include touch screens, virtual keyboards, touch pads, pointing devices, and other human interface devices. Each of the sets of internal components 800A,B also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

It is understood in advance that although this disclosure includes a detailed description on cloud computing, implementation of the teachings recited herein are not limited to a cloud computing environment. Rather, some embodiments are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
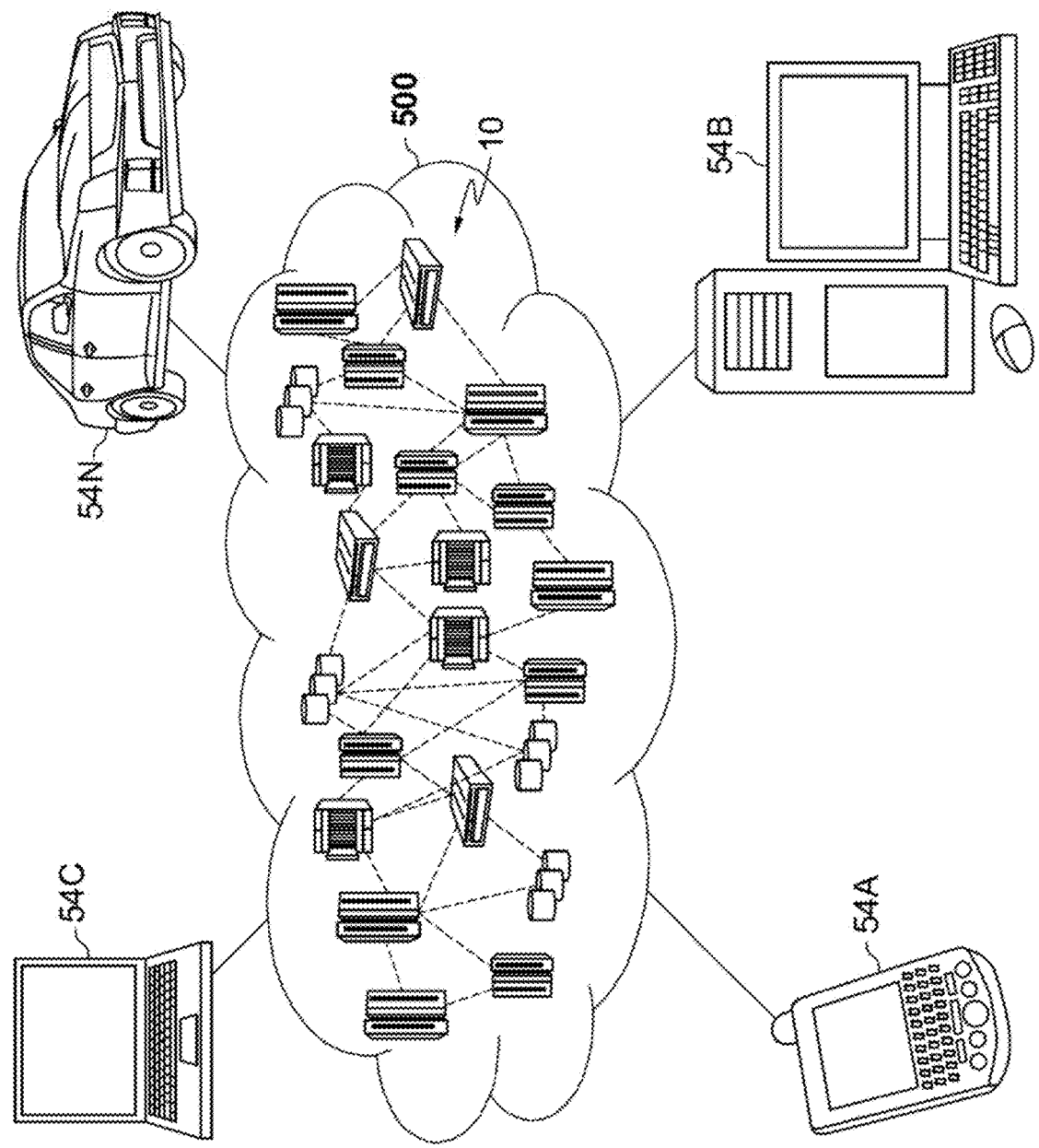
FIG. 5 is a block diagram of an illustrative cloud computing environment including the computer system depicted in FIG. 1, according to at least one embodiment.

Referring to FIG. 5, illustrative cloud computing environment 500 is depicted. As shown, cloud computing environment 500 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 54A-N shown in FIG. 5 are intended to be illustrative only and that cloud computing nodes 10 and cloud computing environment 500 can communicate with any type of computerized device over any type of network and/or network addressable connection (e.g., using a web browser).

Figure 6:
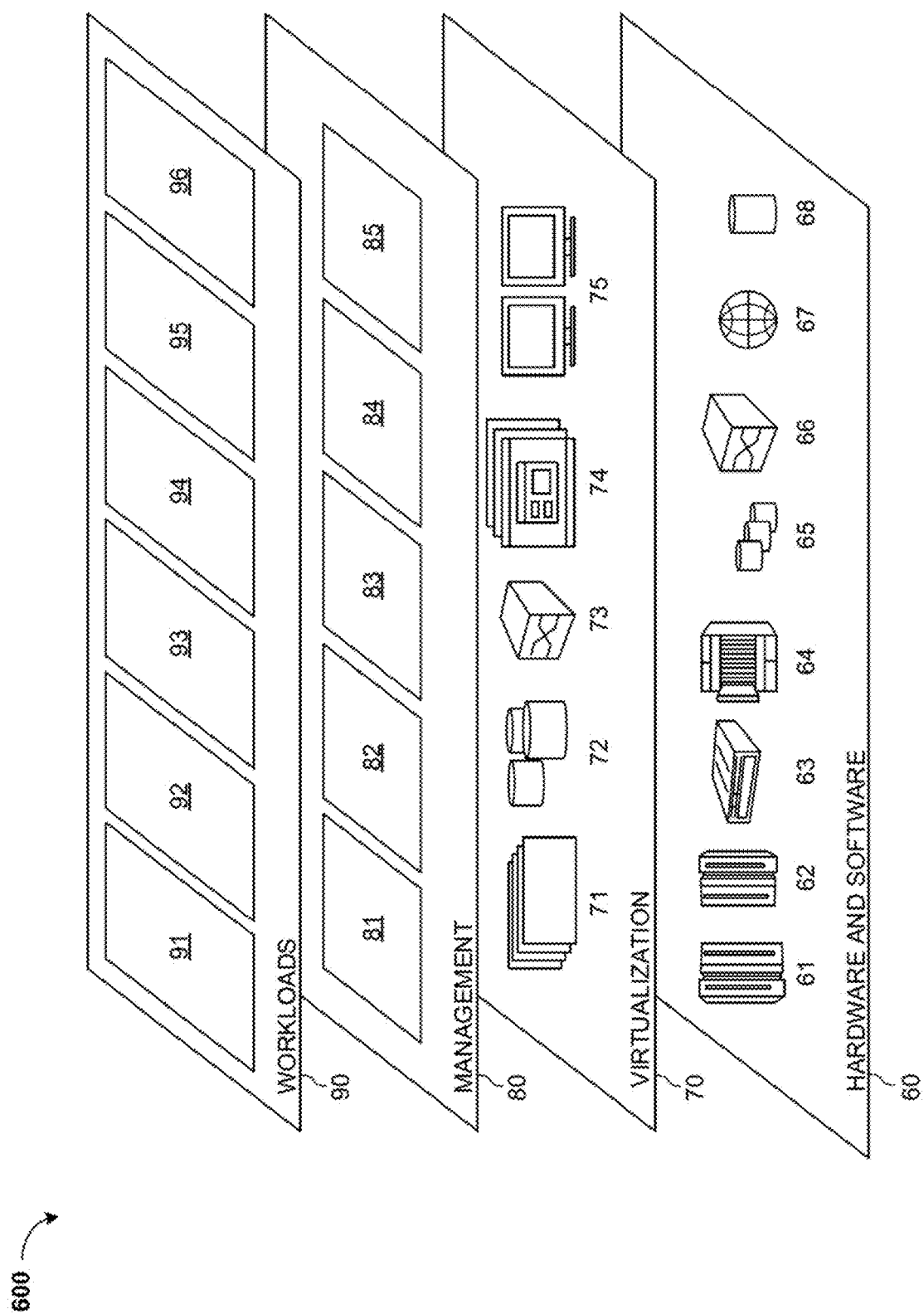
FIG. 6 is a block diagram of functional layers of the illustrative cloud computing environment of FIG. 5, according to at least one embodiment.

Referring to FIG. 6, a set of functional abstraction layers 600 provided by cloud computing environment 500 (FIG. 5) is shown. It should be understood in advance that the components, layers, and functions shown in FIG. 6 are intended to be illustrative only and embodiments are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and Quantizability Regularization 96. Quantizability Regularization 96 may compress a neural network model based on quantizability regularization.

Some embodiments may relate to a system, a method, and/or a computer readable medium at any possible technical detail level of integration. The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for compressing a neural network model for deployment on a terminal, executable by a processor, comprising:
   reshaping, for a layer in a deep neural network model, a weight tensor having a first dimension into a reshaped weight tensor having a second dimension, the second dimension being less than the first dimension,
      wherein a size of the reshaped weight tensor is based on a number of input channels, a number of output channels, and an axis along which the weight tensor is reshaped;
   partitioning, for the layer in the deep neural network model, the reshaped weight tensor into one or more blocks;
   averaging, for the layer in the deep neural network model, weights within respective blocks of the one or more blocks;
   ranking, for the layer in the deep neural network model, the one or more blocks of the reshaped weight tensor based on a loss associated with the respective blocks;
   fixing, for the layer in the deep neural network model, the averaged weights within respective blocks of the one or more blocks for a predetermined number of ranked blocks and setting a respective item corresponding to a respective block in a quantization mask as a fixed value based on the average weight of the respective block;
   training the deep neural network model based on updating un-fixed weights associated with a remaining number of ranked blocks;
   compressing the deep neural network model, for each layer in the deep neural network model, based on the averaged weights for respective layers of the neural network.

2. The method of claim 1, wherein updating the un-fixed weights is based on a gradient and a quantization mask associated with the averaged weights.

3. The method of claim 1, wherein each layer of the deep neural network model is compressed separately.

4. A computer system for compressing a neural network model for deployment on a terminal, the computer system comprising:
   one or more computer-readable non-transitory storage media configured to store computer program code; and
   one or more computer processors configured to access said computer program code and operate as instructed by said computer program code, said computer program code including:
      reshaping code configured to cause the one or more computer processors to reshape, for a layer in a deep neural network model, a weight tensor having a first dimension into a reshaped weight tensor having a second dimension, the second dimension being less than the first dimension,
         wherein a size of the reshaped weight tensor is based on a number of input channels, a number of output channels, and an axis along which the weight tensor is reshaped;
      partitioning code configured to cause the one or more computer processors to partition for the layer in the deep neural network model, the reshaped weight tensor into one or more blocks;
      unifying code configured to cause the one or more computer processors to average, for the layer in the deep neural network model, weights within respective blocks of the one or more blocks;
      ranking code configured to cause the one or more computer processors to rank, for the layer in the deep neural network model, the one or more blocks of the reshaped weight tensor based on a loss associated with the respective blocks;
      fixing code configured to cause the one or more computer processors to fix, for the layer in the deep neural network model, the averaged weights within respective blocks of the one or more blocks for a predetermined number of ranked blocks and setting a respective item corresponding to a respective block in a quantization mask as a fixed value based on the average weight of the respective block;
      training code configured to cause the one or more computer processors to train the deep neural network model based on updating un-fixed weights associated with a remaining number of ranked blocks; and
      compressing code configured to cause the one or more computer processors to compress the deep neural network model, for each layer in the deep neural network model, based on the averaged weights for respective layers of the neural network.

5. The computer system of claim 4, wherein the unifying code comprises:
   quantizing code configured to cause the one or more computer processors to quantize weight coefficients; and
   selecting code configured to cause the one or more computer processors to determine an average or a mean of weight coefficients based on minimizing a quantizability regularization loss value corresponding to a data loss value and a quantization loss value associated with the quantized weight coefficients.

6. The computer system of claim 5, wherein the training code is further configured to cause the one or more computer processors to train the deep neural network model based on back-propagating the minimized quantizability regularization loss value.

7. The computer system of claim 4, wherein updating the un-fixed weights is based on a gradient and a quantization mask associated with the averaged weights.

8. The computer system of claim 4, wherein each layer of the deep neural network model is compressed separately.

9. A non-transitory computer readable medium having stored thereon a computer program for compressing a neural network model for deployment on a terminal, the computer program configured to cause one or more computer processors to:
   reshape, for a layer in a deep neural network model, a weight tensor having a first dimension into a reshaped weight tensor having a second dimension, the second dimension being less than the first dimension, wherein a size of the reshaped weight tensor is based on a number of input channels, a number of output channels, and an axis along which the weight tensor is reshaped;

partition, for the layer in the deep neural network model, the reshaped weight tensor into one or more blocks;

average, for the layer in the deep neural network model, weights within respective blocks of the one or more blocks;

rank, for the layer in the deep neural network model, the one or more blocks of the reshaped weight tensor based on a loss associated with the respective blocks;

fix, for the layer in the deep neural network model, the averaged weights within respective blocks of the one or more blocks for a predetermined number of ranked blocks and setting a respective item corresponding to a respective block in a quantization mask as a fixed value based on the average weight of the respective block;

train the deep neural network model based on updating un-fixed weights associated with a remaining number of ranked blocks;

compress the deep neural network model, for each layer in the deep neural network model, based on the averaged weights for respective layers of the neural network.

10. The computer readable medium of claim 9, wherein the computer program is further configured to cause one or more computer processors average weights based on:
quantizing weight coefficients; and
determine an average or a mean of weight coefficients based on minimizing a quantizability regularization loss value corresponding to a data loss value and a quantization loss value associated with the quantized weight coefficients.

11. The computer readable medium of claim 10, wherein training further comprises training the deep neural network model based on back-propagating the minimized quantizability regularization loss value.

12. The computer readable medium of claim 9, wherein updating the un-fixed weights is based on a gradient and a quantization mask associated with the averaged weights.

* * * * *